United States Patent
Riblett et al.

(10) Patent No.: US 7,195,370 B2
(45) Date of Patent: Mar. 27, 2007

(54) RECHARGEABLE TRIANGULAR LIGHT EMITTING WAND

(76) Inventors: Edward L. Riblett, 1650 S. Pennsylvania Ave., Winter Park, FL (US) 32789; Ishan Sh. Saleem, 5864 Avvers Blvd., #204, Orlando, FL (US) 32807-3772

( * ) Notice: Subject to any disclaimer, the term of this patent is extended or adjusted under 35 U.S.C. 154(b) by 137 days.

(21) Appl. No.: 10/969,653

(22) Filed: Oct. 20, 2004

(65) Prior Publication Data

US 2006/0082988 A1    Apr. 20, 2006

(51) Int. Cl.
*A45B 3/02*    (2006.01)
(52) U.S. Cl. ............... 362/120; 362/102; 362/184; 362/190; 362/800
(58) Field of Classification Search ............ 362/120, 362/102
See application file for complete search history.

(56) References Cited

U.S. PATENT DOCUMENTS

| | | | |
|---|---|---|---|
| 5,036,442 A | 7/1991 | Brown | |
| 5,060,123 A | 10/1991 | Arnold | |
| 5,079,679 A | 1/1992 | Chin-Fa | |
| 5,081,568 A * | 1/1992 | Dong et al. | 362/184 |
| 5,086,377 A * | 2/1992 | Roberts | 362/102 |
| 5,105,309 A * | 4/1992 | Baravaglio et al. | 359/530 |
| 5,392,203 A | 2/1995 | Harris, Jr. | |
| 5,463,229 A * | 10/1995 | Takase et al. | 257/59 |
| 5,622,423 A | 4/1997 | Lee | |
| 5,697,695 A | 12/1997 | Lin et al. | |
| 6,293,684 B1 | 9/2001 | Riblett | |
| 6,301,792 B1 * | 10/2001 | Speer | 30/541 |
| 2004/0264172 A1 * | 12/2004 | Roberts | 362/102 |
| 2005/0083679 A1 * | 4/2005 | Macierowski et al. | 362/102 |
| 2006/0049956 A1 * | 3/2006 | Taylor et al. | 340/815.67 |

* cited by examiner

*Primary Examiner*—Renee Luebke
*Assistant Examiner*—Mary Zettl
(74) *Attorney, Agent, or Firm*—The Livingston Firm; Edward M. Livington, Esq.; Angela M. Miller, Esq.

(57) ABSTRACT

A rechargeable triangular light emitting wand having a base tube (1) and a light tube (4). The base tube contains a rechargeable stored-energy unit (2) in addition to being a handle and a daytime signaler. The light tube (4) contains a light emitter which includes a plurality of light-emitting diode units (18) on a circuit board (14) having at least three sides to permit a person to see the light-emitting diode units (18) from any angle. The light tube has a push button (3) for selective switching of current for the light emitter. Moisture-proof pivotal attachment of the light tube to the base tube, moisture-proof construction of the light tube and moisture-proof construction of the base tube render the entire wand moisture-proof.

15 Claims, 2 Drawing Sheets

RECHARGEABLE TRIANGULAR LIGHT EMITTING WAND

BACKGROUND OF THE INVENTION

This invention relates to hand-held lights having cylindrical or rod-shaped transmitters of light used mostly for wand-like signaling and warning.

There are numerous known types and descriptions of signaling rods and lights. A major use is for directing traffic. Particularly in parts of the world with much automobile traffic but inadequate traffic lights and low-cost labor, they are used extensively for human direction of automobile and pedestrian traffic. A predominant use worldwide is at airports for ground crews to direct positioning of aircraft. A wide range of uses is for various warning signals and for broad illumination.

Most early signaling lights were adaptations of flashlights. Later, light emitting diodes (LEDs) became widely used. Then there was a revival of flashlights that were specially designed and structured for signaling rods or wands.

Examples of most-closely related known but yet different wand-like lights are described in the following patent documents. U.S. Pat. No. 6,293,684, issued to Riblett on Sep. 25, 2001, described a wand light having a base tube with a light-tube end in which a base end of a light tube is pivotal concentrically with pivotal-light-switch attachment of the light tube to the base tube. The base tube contained a stored-energy unit in addition to being a handle and a daytime signaler. The light tube contained a light emitter which can include a flashlight bulb or a plurality of light-emitting diode units on a circuit board. U.S. Pat. No. 5,697,695, issued to Lin, et al. on Dec. 16, 1997, described a "signal stick" with red, yellow and green LEDs that were timed automatically like a traffic light or manually with current from flashlight batteries. U.S. Pat. No. 5,622,423, issued to Lee on Apr. 22, 1997, described a hand-carried traffic-control light having a printed circuit board with a plurality of openings where LEDs were positioned in a transparent tube on an end of a flashlight and having a flashlight bulb at an end of the transparent tube with push-switch control. U.S. Pat. No. 5,392,203, issued to Harris, Jr. on Feb. 21, 1995, described a signal-light assembly with an elongate translucent, brightly colored and watertight tube in which batteries were positioned in a daytime-signal portion for powering a bulb to light a nighttime-signal portion internally. U.S. Pat. No. 5,081,568, issued to Dong, et al. on Jan. 14, 1992, described a police baton with automated or optionally manual switching between red, yellow and green LEDs in a transparent tube on an end of a flashlight for directing traffic. U.S. Pat. No. 5,079,679, issued to Chin-Fa on Jan. 7, 1992, described a multi-purpose directing stick having a battery-operated whistle in an elongate light tube on an end of a flashlight handle. U.S. Pat. No. 5,060,123, issued to Arnold on Oct. 22, 1991, described a flashlight in a policeman's billy club. U.S. Pat. No. 5,036,442, issued to Brown on Jul. 30, 1991, described an illuminated wand with optional hooks on ends for attachment to objects like wheels.

The novel features of the present invention include a circuit board having at least three sides on which light emitting diodes are located, a rechargeable battery and rechargeable mounting stand. Because the circuit board has at least three sides, the light diodes are visible from many more angles as compared to those described in the prior art.

SUMMARY OF THE INVENTION

Objects of patentable novelty and utility taught by this invention are to provide a wand light which:
can be seen from all angles in relation to the wand light;
is rechargeable;
can have heavy-duty construction for rigorous use;
can be waterproofed for use in rain, floods and slushy environments;
has protected switching that cannot be activated unintentionally or accidentally;
has a handle portion that is optionally bright-colored for daylight signaling;
has a light tube that is optionally clear for lighting with selectively colored LEDs or brightly colored for a selected fixed-color lighting;
is resilience-cushioned against impact damage to electrical components and circuitry;
has optional selectivity of predetermined LED-color lighting; and
can be sized adaptively for a plurality of select uses.

This invention accomplishes these and other objectives with a wand light having a base tube with a light-tube end in which a base end of a light tube is pivotal concentrically with pivotal-light-switch attachment of the light tube to the base tube. The base tube contains stored electrical energy, electrical conveyances, push button electrical contacts and a tubular light-tube attachment. The light tube contains a plurality of LEDs on a circuit board having at least three sides that is predeterminedly transparent and shockproof resilient. Waterproof pivotal attachment of the light tube to the base tube, waterproof construction of the light tube and waterproof construction of the base tube render the entire wand light waterproof. Predetermined ruggedness, diameter, length, diameter per length and length of the light tube per length of the base tube render it adaptable to a wide variety of uses. Daytime signaling is provided by appropriate coloring and brightness of coloring of the base tube while being handheld with the light tube or a colored lens (light tube) with internal and/or external reflecting ribs. Nighttime signaling is provided by appropriate coloring and brightness of coloring of the light tube and the LEDs while being handheld with the base tube. Because the circuit board has at least three sides and is flexible, it can be bent into a triangular shape within the light tube so as to permit visualization of the signals from all angles.

In addition, the LEDs may flash in various modes, including, but not limited to, a flashing mode and a solid mode and may flash or remain solid in either one color or in a plurality of colors, such as red and green.

Finally, the rechargeable triangular light emitting wand may include a Global Positioning System (GPS) so as to permit others to locate the geographical location of the wand.

The above and other objects, features and advantages of the present invention should become even more readily apparent to those skilled in the art upon a reading of the following detailed description in conjunction with the drawings wherein there is shown and described illustrative embodiments of the invention.

BRIEF DESCRIPTION OF DRAWINGS

This invention is described by appended claims in relation to description of a preferred embodiment with reference to the following drawings which are explained briefly as follows:

DESCRIPTION OF PREFERRED EMBODIMENT

Figure 1:
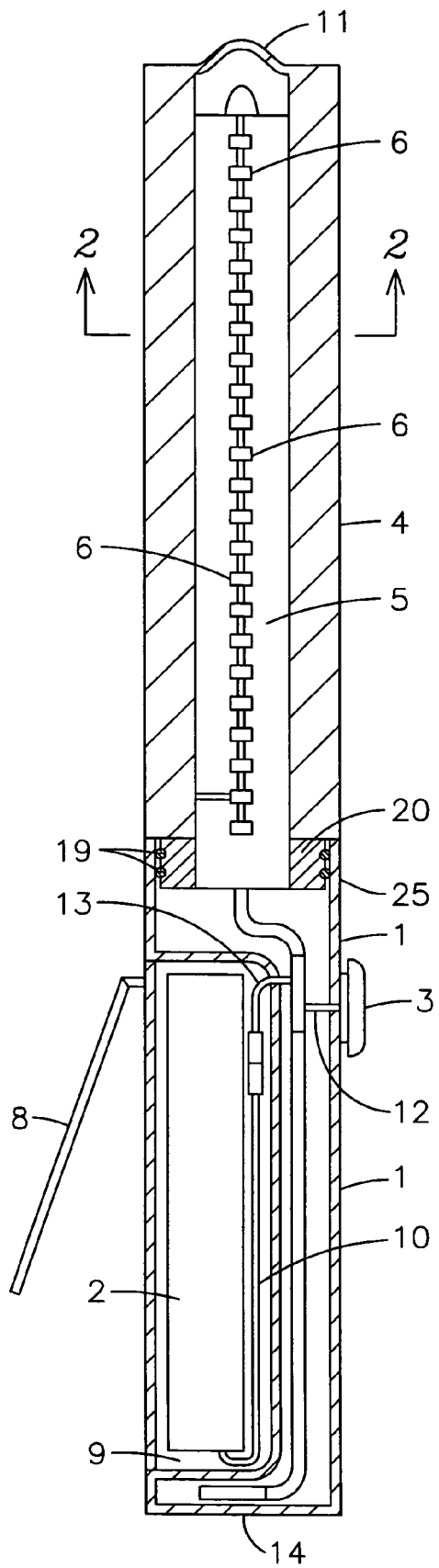
FIG. 1 is a partially cutaway side elevation view of a rechargeable triangular light emitting wand having a plurality of staggered LEDs on a three sided circuit board.
Figure 2:
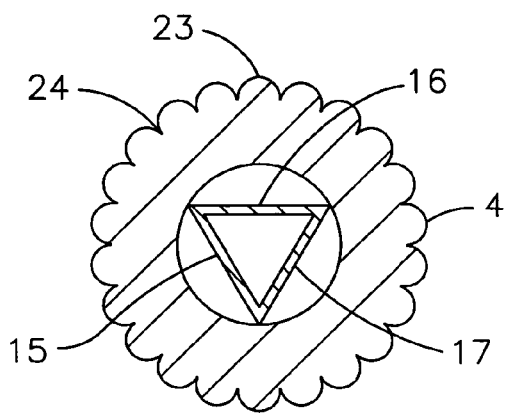
Figure 3:
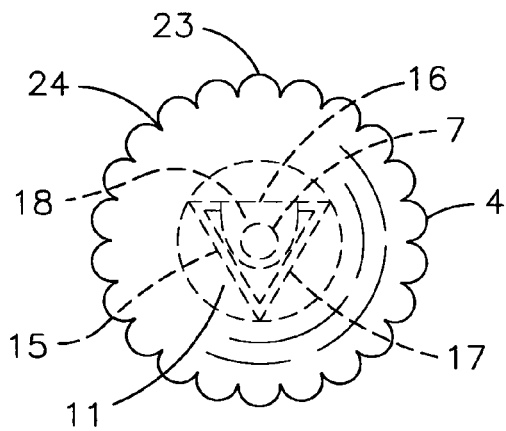
FIG. 3 is an enlarged top view of a top end of the light tube of FIG. 1.
Figure 4:
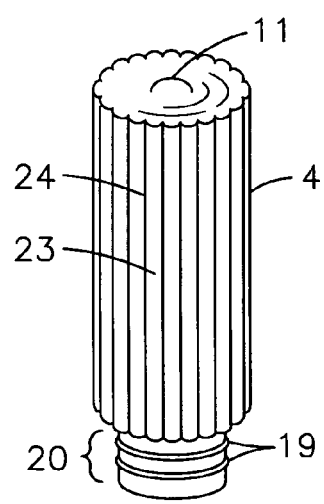
FIG. 4 is a perspective view of the light tube of the present invention.

Listed numerically below with reference to the drawings are terms used to describe features of this invention. These terms and numbers assigned to them designate the same features throughout this description.
1. base tube
2. stored energy unit
3. push button
4. light tube
5. circuit board
6. LED unit
7. White LED
8. strap
9. stored energy unit compartment
10. stored energy unit electrical connection to circuit board
11. top end of light tube
12. circuit board electrical connection to push button
13. circuit board electrical connection to stored energy unit
14. base end of base tube
15. first side of circuit board
16. second side of circuit board
17. third side of circuit board
18. circuit board tab
19. o-ring
20. base attachment end
21. folding lines
22. stored energy compartment door
23. linear rib
24. linear groove
25. light attachment end
26. double rechargeable mounting base Referring first to FIGS. 1–4, the present invention comprises a base tube 1 having a base end 14 and a light attachment end 25 and a light tube 4 removably attachable to the light attachment end 25. The base tube 1 has stored energy unit compartment 9 to hold a stored energy unit 2 and has a push button 3 on/off switch. In addition, a strap 8 may be attached to the base tube 1 for easy transportation. The stored energy unit 2 is rechargeable. The stored energy unit has a stored energy electrical connection to a circuit board 10.

The light tube 4, preferably a transparent tough plastic material, has a base attachment end 20 and a top end 11, which is preferably dome-shaped. The base attachment end has o-rings 19 so as to maintain a secure fit within the base tube 1. The light tube 4 is preferably circular so as to house a circuit board 5.

The circuit board 5 preferably has at least a first side 15, a second side 16 and a third side 17. The second side of the circuit board 16 has a circuit board tab 18 wherein a white LED 7 is located. Although the preferably LED is white, other colors may be used.

The circuit board 5 preferably has a plurality of LED units 6 electrically connected to one another. The LED units 6 may be in a staggered formation or in a linear formation on the circuit board 5. The circuit board 5 has a circuit board electrical connection to the push button 12 and a circuit board electrical connection to the stored energy unit 13. Thus, a complete circuit is created wherein the stored energy unit 2 provides an electrical current to the circuit board 5 when a user presses the push button 3 on.

The LED units 6 may be a single-color or multi-colored. In addition, the LED units may flash or remain in a solid mode. For instance, a first mode of the invention may have the LED units 6 remain in a solid green color. A second mode of the invention may have the LED units 6 flash a green color. A third mode of the invention may have the LED units 6 remain in a solid red color. A fourth mode of the invention may have the LED units 6 flash a red color. A user may switch modes simply by pressing the push button 3 while continuing to press on the button 3 will go to Off mode at any time. Furthermore, another mode of the invention may have only the white LED 7 on the end of the light tube 4 shining.

Both ends of this wand light are useable for signaling in all ambient lightness and darkness conditions. Preferably, the base tube 1 is colored for daylight or relatively lightness signaling. The light tube 4 is colored externally and/or internally with colored LEDs for nighttime or relatively darkness signaling.

The light tube 9 preferably has linear ribs 23 and linear grooves 24 to provide structural integrity and to aid in light transmission.

Figure 5:
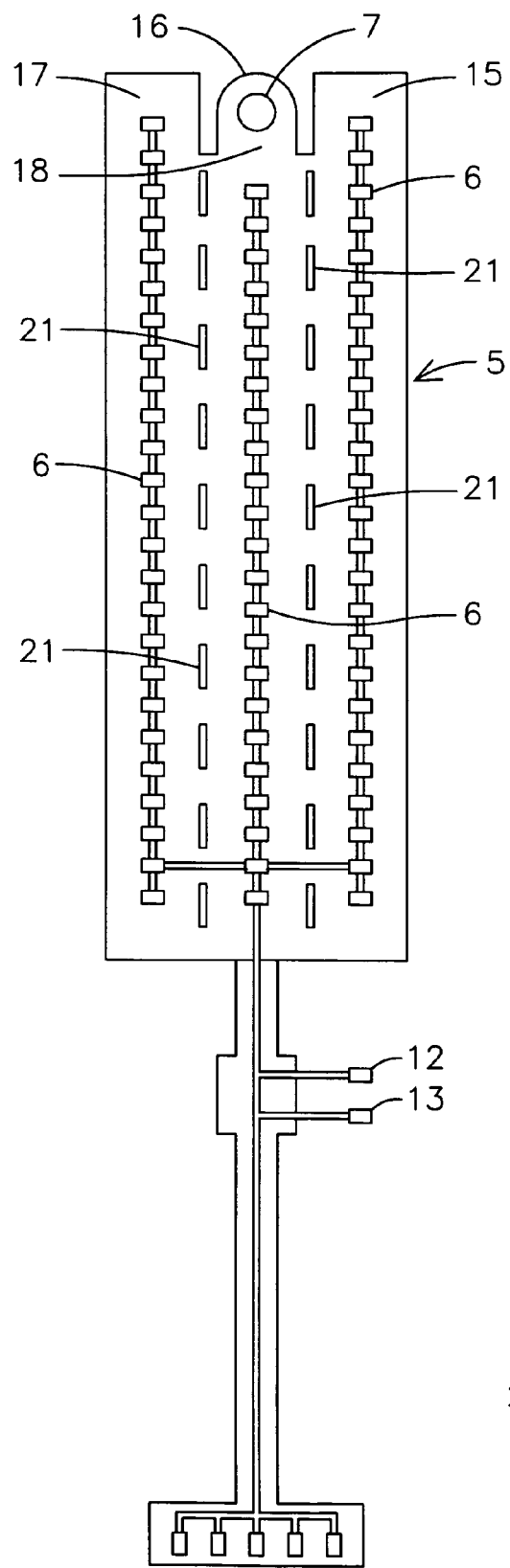
FIG. 5 is a front view of a circuit board of the present invention laid flat.

With reference to FIG. 5, a front view of the circuit board 5 of the present invention laid flat is shown. The circuit board 5 has a first side 15, a second side 16 and a third side 17 wherein the second side 16 has a circuit board tab 18. The circuit board tab has a white LED 7 located thereon. The circuit board 5 has a plurality of folding lines 21 so as to enable triangular folding of the circuit board 5 for insertion into the light tube 4.

Figure 6:
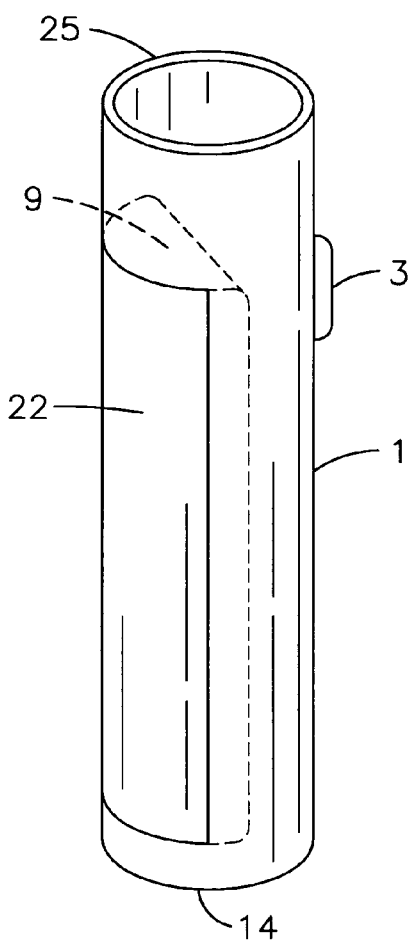
FIG. 6 is a plan view of a base tube of the present invention.

In FIG. 6, a plan view of the base tube 1 of the present invention is shown. A stored energy unit compartment door 22 maintains the stored energy unit 2 within the stored energy unit compartment 9.

Figure 7:
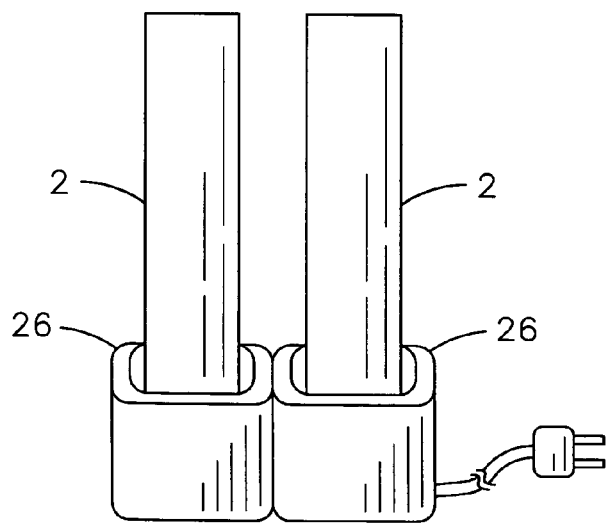
FIG. 7 is a perspective view of a rechargeable mounting base of the present invention.

Finally in FIG. 7, a double rechargeable mounting base 26 for two stored energy units 2 is shown. The double rechargeable mounting base 26 permits a person to recharge two stored energy units 2 should the stored energy units 2 become low in power. However, if a user need only recharge one stored energy unit 2, he or she may use only one side of the double rechargeable mounting base 26.

A new and useful rechargeable triangular light emitting wand having been described, all such foreseeable modifications, adaptations, substitutions of equivalents, mathematical possibilities of combinations of parts, pluralities of parts, applications and forms thereof as described by the following claims and not precluded by prior art are included in this invention.

We claim:

1. A rechargeable triangular light emitting wand comprising:
   a base tube having a base end and a light attachment end;
   a rechargeable stored energy unit in the base tube;
   a light tube having a base attachment end and a top end;
   a circuit board having at least a first side, a second side and a third side;
   the circuit board having a plurality of LED units electrically connected to the circuit board; and the circuit board being electrically connected to the rechargeable stored energy unit in the base tube, wherein the second side of the circuit board has a circuit board tab having a white LED electrically connected to the circuit board.

2. The rechargeable triangular light emitting wand of claim 1 further comprising a rechargeable mounting stand.

3. The rechargeable triangular light emitting wand of claim 1 wherein:
the base attachment end of the light tube has at least one O-ring.

4. The rechargeable triangular light emitting wand of claim 1 wherein:
the LED units are a single color.

5. The rechargeable triangular light emitting wand of claim 1 wherein:
the circuit board is electrically connected to a push button.

6. The rechargeable triangular light emitting wand of claim 1 wherein:
the light tube has linear ribs and grooves for light deflection.

7. The rechargeable triangular light emitting wand of claim 1 wherein:
the LED units are linear-positioned on the at least three sides of the circuit board.

8. The rechargeable triangular light emitting wand of claim 1 wherein:
the LED units are multi-colored.

9. The rechargeable triangular light emitting wand of claim 6 wherein:
the push button activates at least one mode of the LED units.

10. The rechargeable triangular light emitting wand of claim 1 wherein:
the base has a strap.

11. The rechargeable triangular light emitting wand of claim 1 wherein:
the circuit board is predeterminedly transparent.

12. The rechargeable triangular light emitting wand of claim 9 wherein:
the at least one mode is flashing.

13. The rechargeable triangular light emitting wand of claim 9 wherein:
the at least one mode is solid.

14. The rechargeable triangular light emitting wand of claim 9 wherein:
the LED units are red.

15. The rechargeable triangular light emitting wand of claim 9 wherein:
the LED units are green.

* * * * *